United States Patent
Jiang et al.

(10) Patent No.: US 7,122,908 B2
(45) Date of Patent: Oct. 17, 2006

(54) ELECTRONIC DEVICE PACKAGE

(75) Inventors: Tongbi Jiang, Boise, ID (US); Yong Du, Austin, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/775,366

(22) Filed: Feb. 1, 2001

(65) Prior Publication Data

US 2002/0100989 A1    Aug. 1, 2002

(51) Int. Cl.
*H01L 23/48* (2006.01)
*H01L 23/28* (2006.01)
*H01L 23/42* (2006.01)
*H01L 23/52* (2006.01)

(52) U.S. Cl. .............. 257/783; 257/787; 257/788; 257/E23.116; 257/E23.136

(58) Field of Classification Search ............. 257/783, 257/787, 788, 782, 788.789, 778, 702, 701, 257/784, E23.116, E23.136; 525/420
See application file for complete search history.

(56) References Cited

U.S. PATENT DOCUMENTS

| | | | | |
|---|---|---|---|---|
| 4,734,464 A * | 3/1988 | Biensan | ...................... | 525/420 |
| 5,001,542 A * | 3/1991 | Tsukagoshi et al. | .......... | 357/68 |
| 5,148,265 A | 9/1992 | Khandros et al. | | |
| 5,148,266 A | 9/1992 | Khandros et al. | | |
| 5,347,159 A | 9/1994 | Khandros et al. | | |
| 5,550,408 A * | 8/1996 | Kunitomo et al. | .......... | 257/737 |
| 5,552,637 A * | 9/1996 | Yamagata | ................... | 257/717 |
| 5,679,977 A | 10/1997 | Khandros et al. | .......... | 257/692 |
| 5,685,885 A | 11/1997 | Khandros et al. | | |
| 5,759,874 A * | 6/1998 | Okawa | ....................... | 438/124 |
| 5,773,877 A * | 6/1998 | Hu et al. | .................... | 257/666 |
| 5,852,326 A | 12/1998 | Khandros et al. | .......... | 257/692 |
| 5,950,304 A | 9/1999 | Khandros et al. | | |
| 6,049,094 A * | 4/2000 | Penry | ......................... | 257/99 |
| 6,049,129 A * | 4/2000 | Yew et al. | ................... | 257/737 |
| 6,057,381 A * | 5/2000 | Ma et al. | ..................... | 522/99 |
| 6,133,627 A | 10/2000 | Khandros et al. | | |
| 6,144,107 A * | 11/2000 | Narita | ....................... | 257/789 |
| 6,225,418 B1 * | 5/2001 | Satsu et al. | .................. | 525/524 |
| 6,265,782 B1 * | 7/2001 | Yamamoto et al. | ......... | 257/783 |
| 6,265,784 B1 * | 7/2001 | Kawano et al. | ............. | 257/788 |
| 6,395,124 B1 * | 5/2002 | Oxman et al. | .......... | 156/275.5 |
| 6,429,372 B1 * | 8/2002 | Taguchi et al. | ............. | 174/52.4 |
| 6,433,419 B1 | 8/2002 | Khandros et al. | | |
| 6,465,893 B1 | 10/2002 | Khandros et al. | | |
| 2001/0009780 A1 * | 7/2001 | Takeda et al. | ............... | 438/118 |

FOREIGN PATENT DOCUMENTS

EP     0816461     1/1998

(Continued)

*Primary Examiner*—Nitin Parekh
(74) *Attorney, Agent, or Firm*—Schwegman, Lundberg, Woessner & Kluth, P.A.

(57) ABSTRACT

An electronic device package comprises a substrate, a die, and a material having a Young's modulus of between about 0.1 megapascals and about 20 megapascals (at a solder reflow temperature) for attaching the die to the substrate. In one embodiment, the package utilizes a material having a Young's modulus of between about 0.1 megapascals and about 20 megapascals (at a solder reflow temperature) for attaching the die to the substrate. In an alternate embodiment, the package utilizes a material having a coefficient of thermal expansion $\alpha_2$ of less than about 400 (four-hundred) ppm (parts per million)/° C. for attaching the die to the substrate. In another alternate embodiment, the package utilizes a rigid material for attaching the die to the substrate.

117 Claims, 6 Drawing Sheets

| FOREIGN PATENT DOCUMENTS | | | JP | 212518 | 8/2000 |
|---|---|---|---|---|---|
| EP | 2000212518 | 2/2000 | * cited by examiner | | |

ELECTRONIC DEVICE PACKAGE

FIELD OF THE INVENTION

This invention relates to packaging, and more particularly to packaging electronic devices.

BACKGROUND OF THE INVENTION

Electronic devices, such as integrated circuit dice, are packaged using a variety of materials. For example, plastics, ceramics, and glasses are used as substrates and die carriers, while adhesives and polymers are used to attach dice to substrates or other die carriers. Each of the materials used to package electronic devices has a coefficient of thermal expansion that defines a rate of expansion for the material as the temperature of the material changes.

Figure 1A:
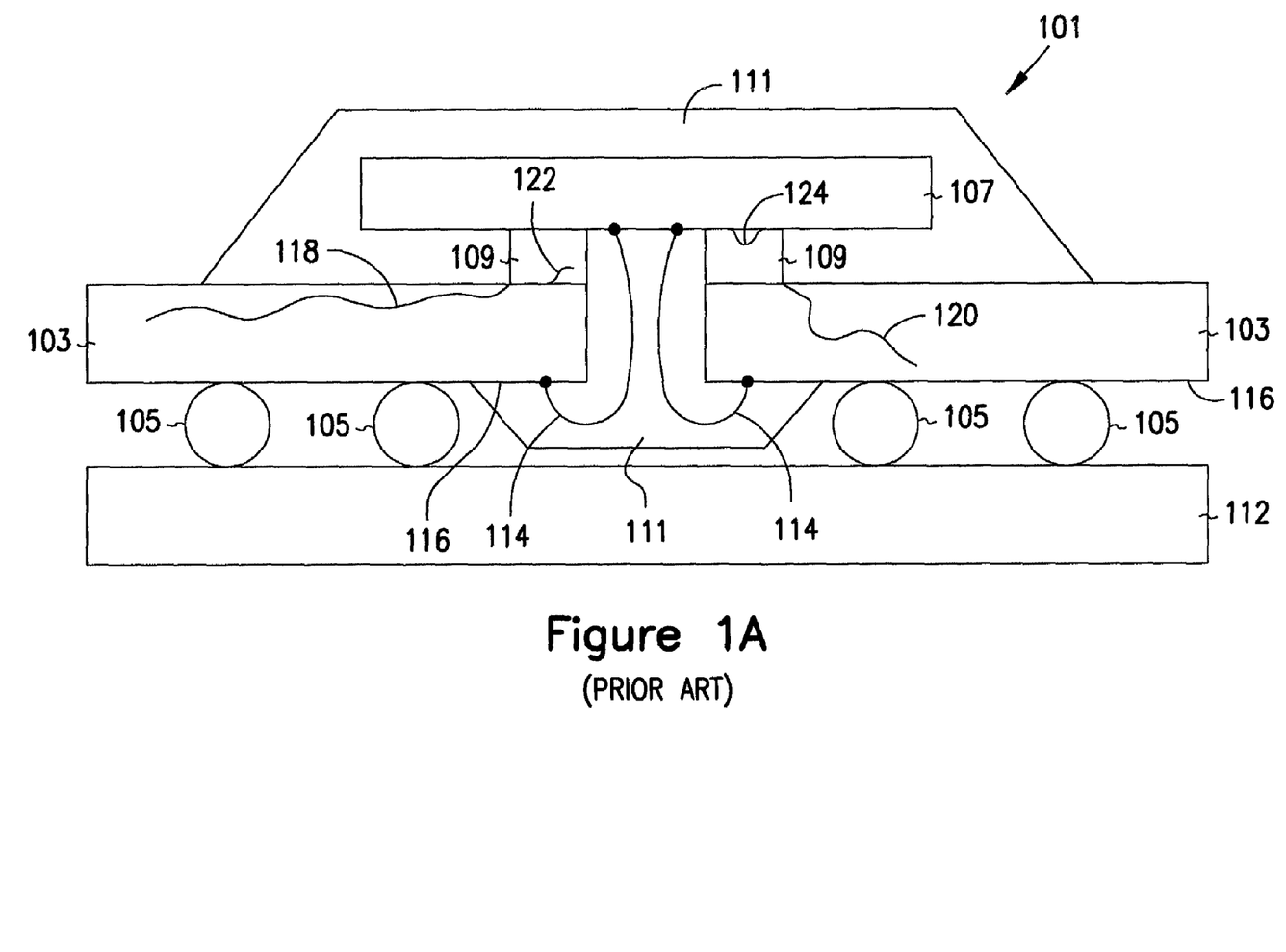
FIG. 1A is a cross-sectional view of a prior art electronic package including an adhesive having a low Young's modulus.

FIG. 1A is a cross-sectional view of a prior art electronic package 101 including an adhesive having a low Young's modulus. The electronic package 101 includes a substrate 103, one or more solder balls 105, a die 107, a die attach material 109, a molding compound 111, and a board 112. In this exemplary package, substrate 103 is fabricated from a ceramic, solder balls 105 are fabricated from a conductor, such as a lead-tin alloy, die 107 is fabricated from a semiconductor, such as silicon, germanium, or gallium arsenide, die attachment material 109 is fabricated from a compliant material, such as an adhesive having a low Young's modulus, molding compound 111 is formed from an epoxide, and board 112 is fabricated from a glass-epoxide. The bond wires 114 electrically couple the die 107 to a bottom surface 116 of the substrate 103.

Figure 1B:
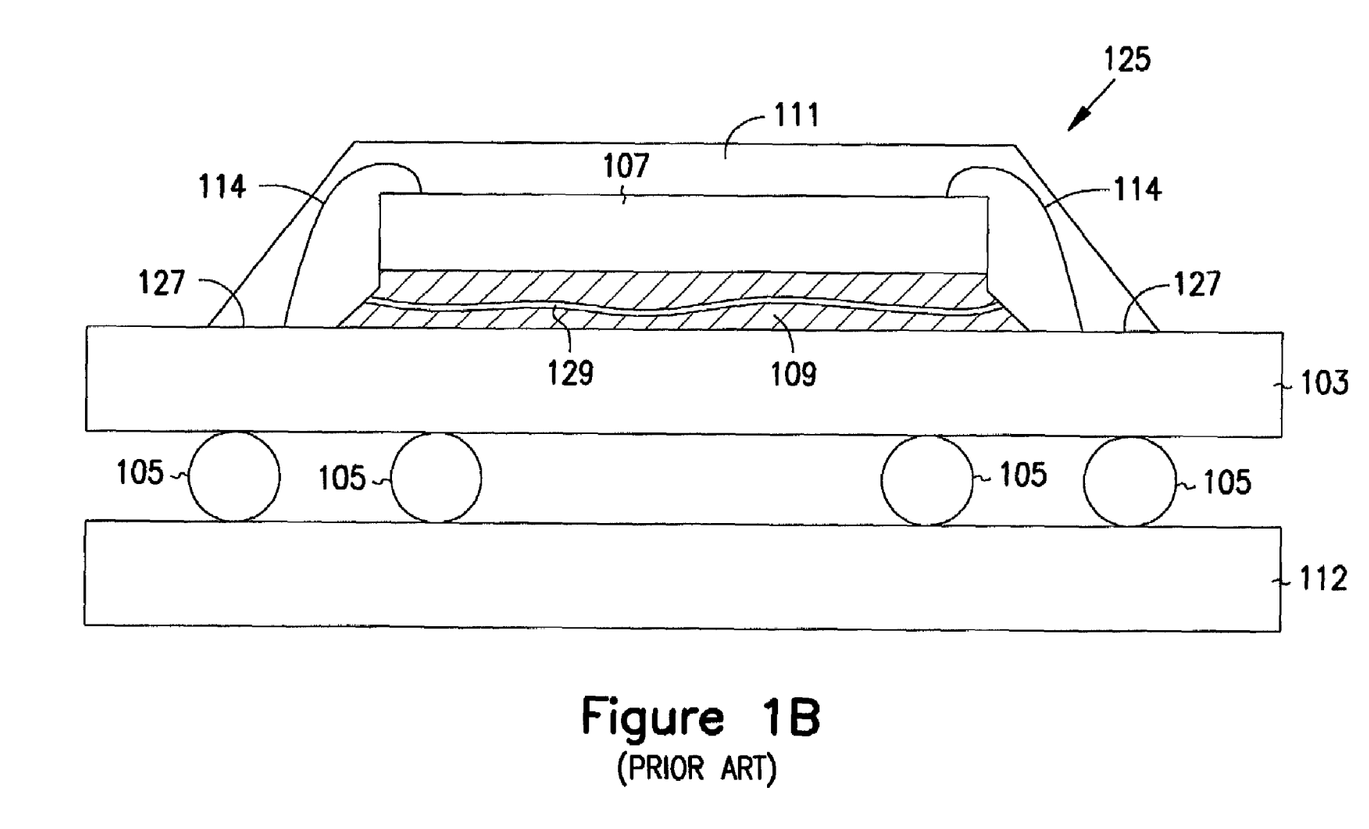
FIG. 1B is a cross-sectional view of an alternative prior art electronic package including an adhesive having a low Young's modulus.

FIG. 1B is a cross-sectional view of an alternative prior art electronic package 125 including an adhesive having a low Young's modulus. The electronic package 125 includes a substrate 103, one or more solder balls 105, a die 107, a die attachment material 109, a molding compound 111, and a board 112. In this exemplary package, substrate 103 is fabricated from a ceramic, solder balls 105 are fabricated from a conductor, such as a lead-tin alloy, die 107 is fabricated from a semiconductor, such as silicon, germanium, or gallium arsenide, die attachment material 109 is fabricated from a compliant material, such as an adhesive having a low Young's modulus, molding compound 111 is formed from an epoxide, and board 112 is fabricated from a glass-epoxide. The bond wires 114 electrically couple the die 107 to a top surface 127 of the substrate 103.

In the manufacture and assembly of electronic device packages, the devices and packages are often subject to temperature changes. For example, during the manufacture of electronic packages 101 and 125 (shown in FIGS. 1A and 1B, respectively), after substrate 103 is positioned on solder balls 105 above board 112, the temperature of solder balls 105 is increased, which causes solder balls 105 to flow and form an electrical connection between substrate 103 and board 112. The temperature change that causes the reflow of solder balls 105 also causes a temperature change in die 107, substrate 103, and die attachment material 109.

Temperature changes can cause mechanical stresses in packages 101 and 125. Thermal mechanical stress is caused in packages 101 and 125 by a change in temperature and a mismatch between the coefficients of thermal expansion of die 107, substrate 103, and die attachment material 109. Moisture induced stress is caused by the vaporization, at high temperatures, of moisture retained in substrate 103 or die attachment material 109. Either thermal mechanical stress or moisture induced stress can cause mechanical tolerances in package 101 to be exceeded, which results in package failure. Referring to FIGS. 1A and 1B, package failures include package cracking, as shown at cracks 118 and 120, delamination of die attachment material, as shown at delamination point 122, deformation of die attachment material, as shown at deformation point 124, and other failures. These failures can result in a reduction in device reliability and may cause total device failure. U.S. Pat. No. 5,679,977 and U.S. Pat. No. 5,852,326 teach that attaching a die to a substrate using a material having a low Young's modulus produces fewer package failures than attaching a die to a substrate using a material having a high Young's modulus, and that improved packaging reliability is obtained by selecting a die attachment material having a very low Young's modulus. In electronic package 125 (shown in FIG. 1B) defects, such as deformation 129, occur in the die attachment material 109, and deformation 129 of the die attachment material 109 can result in dislocation of the die 107 and destruction of the bond wires 114.

Electronic packages, such as electronic package 101 and electronic package 125, are tested using a temperature cycle test. In a temperature cycle test, an electronic package, such as electronic package 101 or electronic package 125, is repeatedly heated and cooled. In one form of the temperature cycle test, electronic packages 101 and 125 are repeatedly heated and cooled between minus 65 degrees Centigrade and 150 degrees Centigrade. Often this cyclic testing results in "cyclic strain" failures. These failures include separation of die attachment material 109 from die 103 and substrate 107 and deformation of die attachment material 109. Electronic packages that fail a "cyclic strain" test also often fail prematurely in the field.

For these and other reasons there is a need for the present invention.

SUMMARY OF THE INVENTION

The above mentioned problems with electronic device packages and other problems are addressed by the present invention and will be understood by reading and studying the following specification. An electronic device package is described that includes a die attachment material that reduces peeling stress and strain in an electronic package.

The present invention provides, in one embodiment, an electronic package including a substrate, a die, and a material having a Young's modulus of between about 0.1 megapascals and about 20 megapascals (at a solder reflow temperature), for attaching the die to the substrate. Attaching the die to the substrate using a material having a Young's modulus of between about 0.1 megapascals and about 20 megapascals (at a solder reflow temperature) and preferably above 1 megapascal reduces peeling stress and strain in the electronic package.

The present invention also provides, in an alternate embodiment, a method of fabricating an electronic package having high reliability. The method comprises mounting a die on a substrate, and securing the die to the substrate using a die attachment material having a Young's modulus of between about 0.1 megapascals and about 20 megapascals (at a solder reflow temperature) and reflowing the solder balls at a temperature of between about 200 degrees Centigrade and about 280 degrees Centigrade.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 2A:
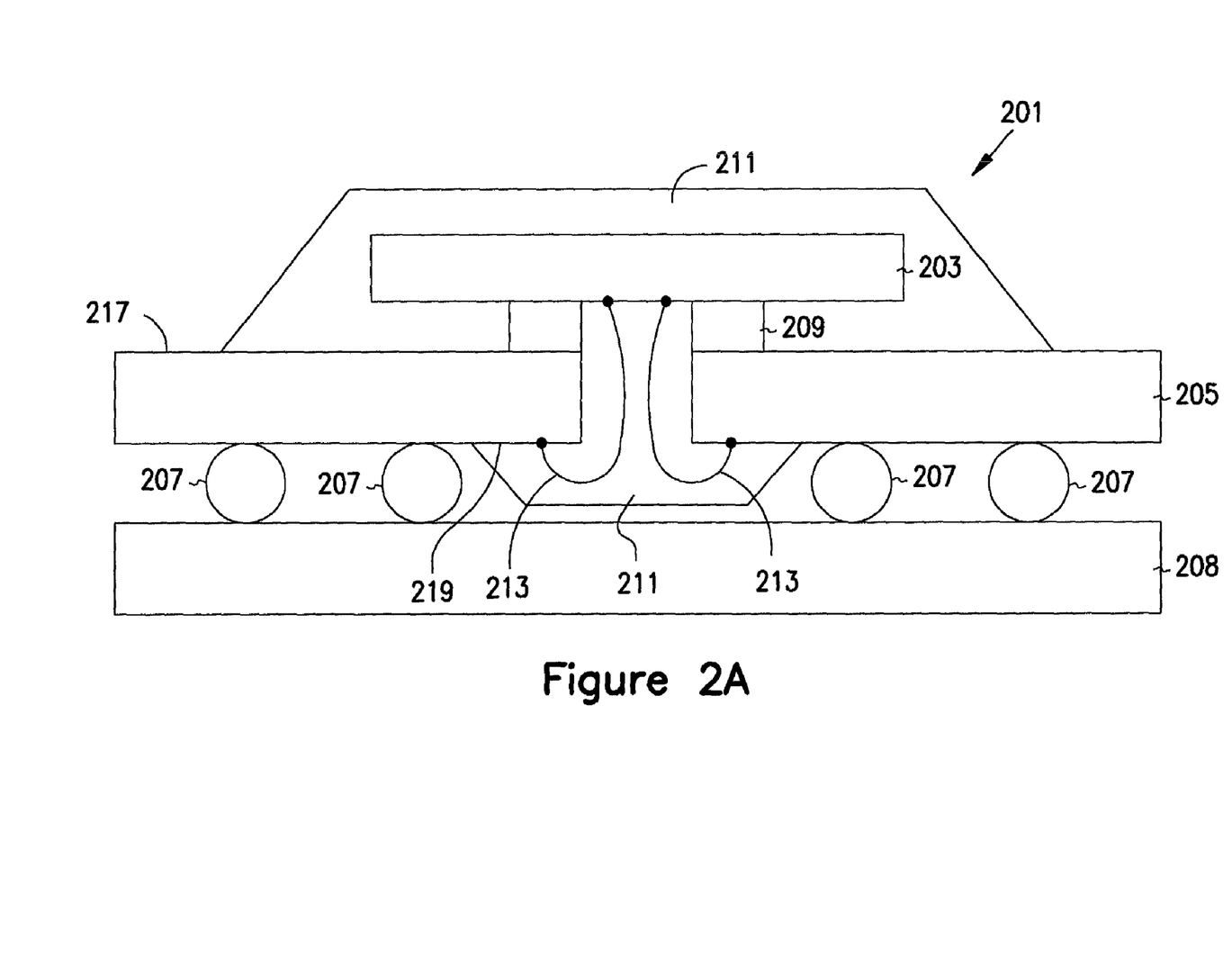
FIG. 2A is a cross-sectional view of one embodiment of an electronic package according to the present invention.

FIG. 2A is cross-sectional view of one embodiment of electronic package 201 according to the present invention. Electronic package 201 comprises a die 203, a substrate 205, one or more solder balls 207 for electronically coupling substrate 205 to board 208, a die attach material 209, and a molding compound 211.

Electronic package 201 is not limited to packaging a particular type of electronic device or system. Electronic package 201 may be used to package any type of integrated circuit, device, or system including but not limited to computing circuits, communication circuits, and memory circuits. Therefore, electronic package 201 may function as an integrated circuit package, such as a logic circuit package, an analog circuit package, or a memory circuit package, or as an electronic system package, such as a computing system package or a communication system package.

Die 203 is typically fabricated from a semiconductor, such as silicon, germanium, or gallium arsenide. In one embodiment of the present invention, die 203 comprises one or more processor circuits, such as a reduced instruction set processor or a complex instruction set processor. In an alternate embodiment, die 203 comprises one or more communication circuits, such as a transmitter, receiver, or transceiver. In still another alternate embodiment, die 203 comprises one or more memory circuits or cells, such as dynamic random access memory circuits or cells, or static random access memory circuits or cells. Each of the circuits, cells, processors, communication devices or other complex systems fabricated on die 203 is typically fabricated from passive and active devices, such as resistors, capacitors, inductors, transistors, and diodes.

Substrate 205 provides a base for mounting die 203. In the present invention, substrate 205 is not limited to a particular material or a particular structure. Substrate 205 may be fabricated from a flexible or inflexible material. Preferably, substrate 205 is fabricated from a chemically inert material that has a coefficient of thermal expansion that is close to the coefficient of thermal expansion of die 203. Exemplary embodiments of substrates suitable for use in connection with the present invention include single metal layer substrates or multi-metal layer substrates, such as printed circuit board (PCB) substrates, such as organic, glass fiber reinforced and ceramic substrates, and flexible substrates, such as polyimide tape substrates. Other exemplary embodiments of substrates suitable for use in connection with the present invention include multilayer substrates, such as multilayer BT epoxy substrates having signal, power, and ground layers.

Board 208 provides a base for mounting substrate 205. In addition, board 208 can provide a base for mounting additional substrates (not shown). Board 208 is not limited to being fabricated from a particular material. Typically, board 208 is fabricated from an inert material that has a coefficient of thermal expansion about equal to the coefficient of thermal expansion of substrate 205. In one embodiment, board 208 is fabricated from a ceramic. In an alternate embodiment, board 208 is fabricated from a glass-epoxide. In still another embodiment, board 208 is fabricated from FR-4. In another alternate embodiment, board 208 is fabricated from polyimide. Board 208 may include any number of conductive layers separated by a non-conductive material, such as a dielectric. In one embodiment, board 208 includes a single conductive layer formed on a dielectric base, such as a layer comprising copper or a copper alloy formed on FR-4. In an alternate embodiment, board 208 includes two or more conductive layers separated by a dielectric, such as layers comprising metal or metal alloys, such as copper alloys separated by polyimide.

The one or more solder balls 207 are preferably fabricated from a conductive material. In one embodiment, the conductive material is a metal or metal alloy. Metals and metal alloys used in exemplary embodiments of the present invention include aluminum, copper, tin, gold, silver, lead, and alloys of aluminum, copper, tin, gold, silver, or lead. Each of the one or more solder balls 207 has a solder reflow temperature. The solder reflow temperature is the temperature at which each of the one or more solder balls 207 makes a sustainable electrical connection to pads (not shown) on substrate 205 and the electrical connection sites (not shown) on board 208. A sustainable electrical connection is a connection for which small stresses and vibrations at the electrical connection do not interfere electrical conduction at the connection. In one embodiment of the present invention, the solder reflow temperature is between about 200 degrees Centigrade and 280 degrees Centigrade.

Die attach material 209 provides a structure for mechanically securing die 203 to substrate 205. Preferably, die attach material 209 maintains contact with die 203 and substrate 205 during and after a solder reflow process, which in one embodiment occurs at between about 200 degrees Centigrade and about 280 degrees Centigrade, as described above. To maintain contact with die 203, die attach material 209 should not peel away from the surface of substrate 205 and should not deform during the solder reflow process. As noted in the background section, U.S. Pat. Nos. 5,679,977 and 5,852,326 teach that a die attach material having a low Young's modulus provides a more reliable structure than a die attach material having a high Young's modulus. According to the present invention, a die attach material having a high Young's modulus provides a more reliable structure than a die attach material having a low Young's modulus. Preferably, die attach material 209 has a Young's modulus of between about 0.1 megapascals and 20 megapascals at the solder reflow temperature of solder balls 207. In one embodiment of the present invention, die attach material 209 has a Young's modulus of between about 0.1 megapascals and 20 megapascals at a solder reflow temperature of between about 200 degrees Centigrade and about 280 degrees Centigrade. In an alternate embodiment, die attach material 209 has a low coefficient of thermal expansion. For example, in one embodiment, die attach material 209 has a $\alpha_2$ of less than about 400 (four-hundred) ppm (parts per million)/° C. $\alpha_2$ is defined as coefficient of thermal expansion at temperature above Tg, the glassy transition temperature. In still another alternate embodiment, die attach material 209 is a rigid material, which is a material that is deficient or devoid of flexibility or a material that is not compliant. In still another alternate embodiment, die attach material 209 is a non-compliant material having a Shore A hardness of more than about 70. In still another alternate embodiment, die attach material 209 has a Shore D hardness of more than about 20. Hardness is measured with an instrument called a Durometer, which pushes a needle-like probe into a specimen to be tested. The farther the needle penetrates into the specimen the lower the Shore reading. The Shore A scale is typically used to measure the hardness of materials such as rubber. The Shore D scale is typically used to measure the hardness of materials such as plastics. However, materials having a Shore A measurement of above about 70 begin to have a hardness similar to plastics, which measure on the low end of the Shore D scale.

Die attach material 209, as used in connection with the present invention, is not limited to a particular material. Any material that exhibits one of the properties described above is suitable for use in connection with the present invention. For example, any material that has a Young's modulus between about 0.1 megapascals and 20 megapascals (at a solder reflow temperature), or an $\alpha_2$ less than about 400 (four-hundred) ppm (parts per million)/° C., or that exhibits rigidity is suitable for use in connection with the present invention. Exemplary materials that are suitable for use in connection with the present invention include epoxides, poly epoxides, acrylates, polyacrylates, polyolefins, and polyimides.

As used herein, an "epoxide" is a cyclic organic compound having an oxygen atom bonded to two other atoms, preferably carbon. As used herein, an "Epoxy" is a diradical of an epoxide. Suitable epoxides are disclosed, e.g., in *Concise Chemical and Technical Dictionary;* 4th Ed.; Chemical Publishing Co., Inc., NY, N.Y. (1986); *Aldrich Catalog Handbook of Fine Chemicals,* Milwaukee, Wis. (1999); the disclosures of which are incorporated by reference herein.

A specific epoxide of the present invention is a compound of the formula:

wherein each of $R_1$, $R_2$, $R_3$, and $R_4$ is independently hydrogen, halo, trifluoromethyl, cyano, hydroxy, nitro, $(C_1–C_{24})$alkyl, $(C_2–C_{24})$alkenyl, $(C_2–C_{24})$alkynyl, $(C_3–C_8)$cycloalkyl, $(C_1–C_{24})$alkyl $(C_3–C_8)$cycloalkyl, $(C_6–C_{10})$aryl, $(C_6–C_{10})$heteroaryl, $(C_1–C_{24})$alkyl $(C_6–C_{10})$aryl, $(C_1–C_{24})$alkyl $(C_6–C_{10})$heteroaryl, $(C_6–C_{10})$aryl $(C_1–C_{24})$alkyl, $(C_6–C_{10})$heteroaryl $(C_1–C_{24})$alkyl, or $(C_3–C_8)$cycloalkyl $(C_1–C_{24})$alkyl;

wherein any alkyl, alkenyl, alkynyl, cycloalkyl, aryl, or heteroaryl can optionally be substituted with one or more (e.g., 1, 2, 3, or 4) halo, trifluoromethyl, cyano, hydroxy, nitro, C(=O)OR$_6$, wherein R$_6$ is hydrogen or $(C_1–C_{24})$alkyl, or NR$_7$R$_8$, wherein each R$_7$ and R$_8$ are independently hydrogen or $(C_1–C_{24})$alkyl; and wherein any alkyl, alkenyl, or alkynyl is optionally interrupted with one or more (e.g., 1, 2, 3, or 4) oxo, thio, sulfonyl, or sulfinyl;

or a suitable salt thereof.

In one specific embodiment of the present invention, the epoxide can be a polymer of one or more epoxides (i.e., two or more epoxy monomers), referred to herein as a poly epoxide. As used herein, a poly epoxide is the polymerization product of one or more epoxides (i.e., two or more epoxy monomers). Those of skill in the art know the reaction conditions in which epoxides can be polymerized. See, e.g., J. March, *Advanced Organic Chemistry, Reactions, Mechanisms and Structure,* (2nd Ed.), McGraw Hill: New York, 1977; F. Carey and R. Sundberg, *Advanced Organic Chemistry, Part B: Reactions and Synthesis,* (2nd Ed.), Plenum: New York, 1977; and references cited therein; which are incorporated by reference herein. For example, the one or more epoxides can be polymerized under basic or acidic conditions.

The polymerization of the one or more epoxides can include materials or compounds that will impart desirable properties to the poly epoxide or that will catalyze the polymerization process. For example, bisphenol A, bisphenol F, and/or CTBN can be employed in the polymerization process.

The number of epoxy monomers in the poly epoxide can range from 2 to about 100,000; from 2 to about 25,000; or from 2 to about 10,000.

The poly epoxide can be formed from one or more epoxides (i.e., the epoxy monomers can be the same or different). When the epoxide monomers are different, the resulting poly epoxide will be a copolymer. As used herein, a "copolymer" is a mixed polymer or heteropolymer formed when two or more unlike monomers (e.g., the epoxide monomers) are polymerized together. *Concise Chemical and Technical Dictionary;* 4th Ed.; Chemical Publishing Co., Inc., NY, N.Y. (1986), p. 336. In one embodiment of the present invention, each of the epoxy monomers are identical. In another embodiment of the present invention, all of the epoxy monomers are not identical (i.e., the epoxy polymer is an epoxy copolymer). In such an embodiment, the number of different epoxy monomers can be from 2 to about 1,000, from 2 to about 100, or from 2 to about 10.

In one specific embodiment of the present invention, the epoxide can be a mixture of two or more poly epoxides, as defined above. The mixture can include 2 to about 100 poly epoxides, 2 to about 50 poly epoxides, or 2 to about 10 poly epoxides.

As used herein, a "polyacrylate" is the polymeric material of one or more esters of alpha beta unsaturated carboxylic acids, e.g., acrylic esters. Suitable acrylic esters include, e.g., methyl acrylate, ethyl acrylate, methyl methacrylate, and ethyl methacrylate. Suitable polyacrylates and acrylic ester monomers are disclosed in, e.g., *Concise Chemical and Technical Dictionary;* 4th Ed.; Chemical Publishing Co., Inc., NY, N.Y. (1986); *Aldrich Catalog Handbook of Fine Chemicals,* Milwaukee, Wis. (1999); the disclosures of which are incorporated by reference herein.

Those of skill in the art know the reaction conditions in which polyacrylate can be formed. See, e.g., J. March, *Advanced Organic Chemistry, Reactions, Mechanisms and Structure,* (2nd Ed.), McGraw Hill: New York, 1977; F. Carey and R. Sundberg, *Advanced Organic Chemistry, Part B: Reactions and Synthesis,* (2nd Ed.), Plenum: New York, 1977; and references cited therein; which are incorporated by reference herein.

Regarding the polyacrylate, the individual esters of the alpha beta unsaturated carboxylic acids can be the same or can be different. In one embodiment of the present invention, each of the esters of the alpha beta unsaturated carboxylic acids are identical. In another embodiment of the present invention, all of the esters of the alpha beta unsaturated carboxylic acids are not identical (i.e., polyacrylate copolymer). In such an embodiment (i.e., polyacrylate copolymer), the number of different esters of alpha beta unsaturated carboxylic acids can be from 2 to about 1,000, from 2 to about 100, or from 2 to about 10.

As used herein, a "polyimide" is a compound that includes two or more imide (C(=O)NHC(=O)) linkages. The polyimide can include a sequence of 2 to about 100,000 imide linkages, 2 to about 50,000 imide linkages, or 2 to about 10,000 imide linkages. The sequence may be linear or cyclic. Suitable polyimides are disclosed, e.g., in *Aldrich Catalog Handbook of Fine Chemicals,* Milwaukee, Wis. (1999); the disclosure of which is incorporated by reference herein.

Those of skill in the art know the reaction conditions in which polyimide can be formed. See, e.g., J. March, *Advanced Organic Chemistry, Reactions, Mechanisms and Structure,* (2nd Ed.), McGraw Hill: New York, 1977; F. Carey and R. Sundberg, *Advanced Organic Chemistry, Part B: Reactions and Synthesis,* (2nd Ed.), Plenum: New York, 1977; and references cited therein; which are incorporated by reference herein.

A specific polyimide of the present invention is a compound of the formula wherein n is 2 to about 1,000;

each $R_1$, $R_2$, and $R_3$ is independently $(C_1-C_{24})$alkyl, $(C_2-C_{24})$alkenyl, $(C_1-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1C_{24})$alkyl;

wherein any alkyl, alkenyl, alkynyl, cycloalkyl, aryl, or heteroaryl can optionally be substituted with one or more (e.g., 1, 2, 3, or 4) halo, trifluoromethyl, cyano, hydroxy, nitro, C(=O)O$R_6$, wherein $R_6$ is hydrogen or $(C_1-C_{24})$ alkyl, or N$R_7R_8$, wherein each $R_7$ and $R_8$ are independently hydrogen or $(C_1-C_{24})$alkyl; and wherein any alkyl, alkenyl, or alkynyl is optionally interrupted with one or more (e.g., 1, 2, 3, or 4) oxo, thio, sulfonyl, or sulfinyl;

or a suitable salt thereof.

Regarding the polyimide, the individual imide monomers can be the same or can be different. In one embodiment of the present invention, each of the imide monomers are identical. In another embodiment of the present invention, all of the imide monomers are not identical (i.e., polyimide copolymer). In such an embodiment (i.e., polyimide copolymer), the number of different imide monomers can be from 2 to about 1,000, from 2 to about 100, or from 2 to about 10.

As used herein, a "polyolefin" is a compound that includes two or more olefin units (i.e., alkene units). Exemplary olefin units include ethylene, propylene, and butylene. The polyolefin can include 2 to about 100,000; 2 to about 50,000; or 2 to about 10,000 olefin units. Additionally, each of the olefin units can be the same or can be different. Specifically, all of the olefin units can be the same. Alternatively, the number of different olefin units can be 2 to about 1,000; 2 to about 100; or 2 to about 10.

Those of skill in the art know the reaction conditions in which polyolefins can be formed. See, e.g., J. March, *Advanced Organic Chemistry, Reactions, Mechanisms and Structure,* (2nd Ed.), McGraw Hill: New York, 1977; F. Carey and R. Sundberg, *Advanced Organic Chemistry, Part B: Reactions and Synthesis,* (2nd Ed.), Plenum: New York, 1977; and references cited therein; which are incorporated by reference herein.

Suitable polyolefins are disclosed, e.g., in *Aldrich Catalog Handbook of Fine Chemicals,* Milwaukee, Wis. (1999); the disclosure of which is incorporated by reference herein.

A specific polyolefin of the present invention is a compound of the formula:

wherein n is 2 to about 100,000;

each $R_1$ and $R_3$ are each independently $(C_1-C_{24})$alkyl, $(C_2-C_{24})$alkenyl, $(C_2-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;

$R_2$ is $(C_2-C_{24})$alkenyl;

wherein any alkyl, alkenyl, alkynyl, cycloalkyl, aryl, or heteroaryl can optionally be substituted with one or more (e.g., 1, 2, 3, or 4) halo, trifluoromethyl, cyano, hydroxy, nitro, C(=O)OR$_6$, wherein R$_6$ is hydrogen or (C$_1$–C$_{24}$) alkyl, or NR$_7$R$_8$, wherein R$_7$ and R$_8$ are each independently hydrogen or (C$_1$–C$_{24}$)alkyl; and wherein any alkyl, alkenyl, or alkynyl of R$_1$ and R$_3$ is optionally interrupted with one or more (e.g., 1, 2, 3, or 4) oxo, thio, sulfonyl, or sulfinyl;

or a suitable salt thereof.

The material can include an epoxide, a poly epoxide (homopolymer or copolymer), an acrylic acid, a polyacrylate, an imide, a polyimide, a polyolefin, a mixture thereof, and/or a copolymer thereof. For example, the material can include a mixture of an epoxide, a polyepoxide, an acrylic acid, a polyacrylate, an imide, a polyolefin, and/or a polyimide. Additionally, the material can include a copolymer formed from two or more epoxides (i.e., a copolymer), a polymer formed from one epoxide (i.e., a homopolymer), a polyacrylate, a polyolefin, and/or a polyimide. In one embodiment of the present invention, the material is a poly epoxide. In another embodiment of the present invention, the material is a mixture of (1) a poly epoxide and (2) a polyimide. In another embodiment of the present invention, the material is a copolymer of (1) a poly epoxide and (2) a polyimide.

Figure 2B:
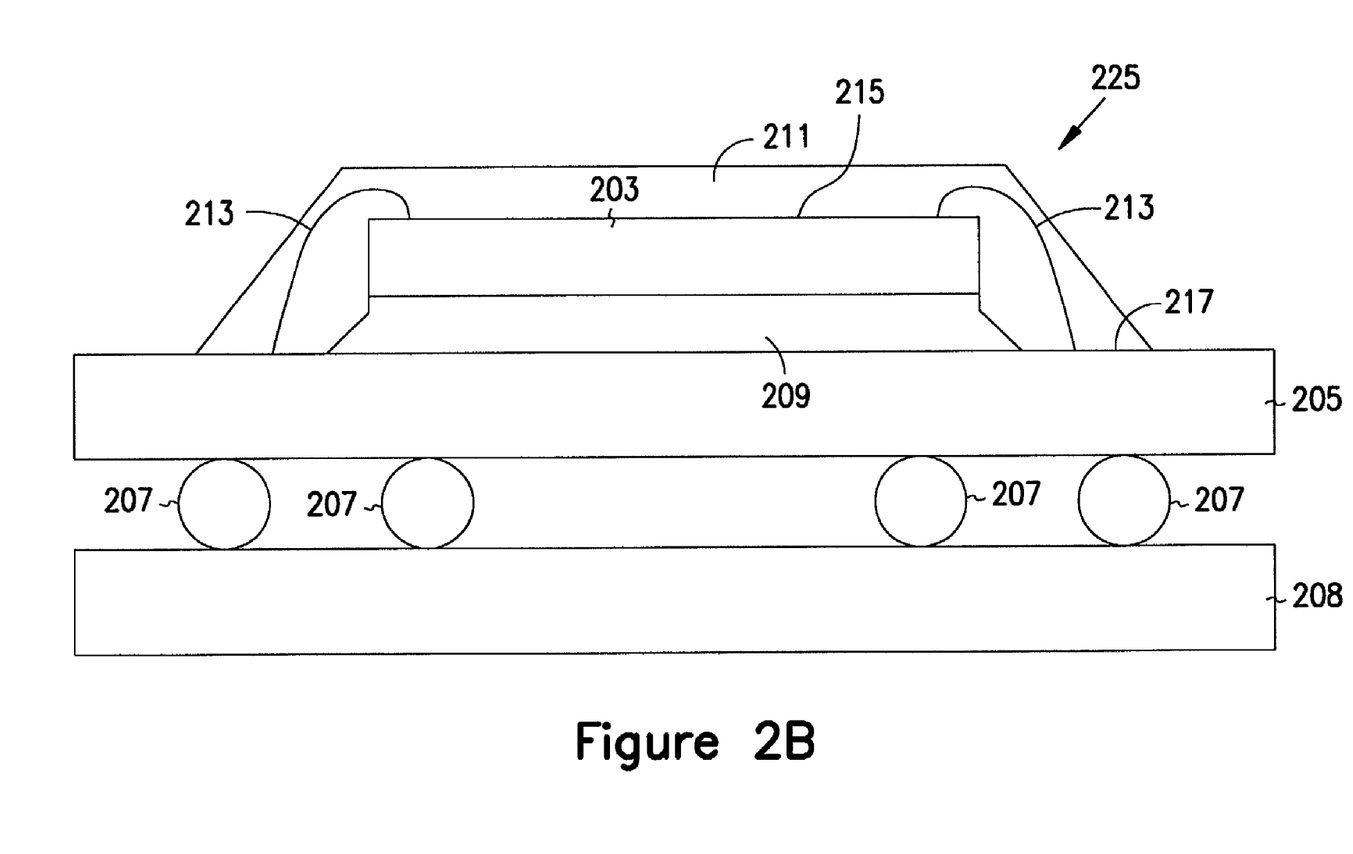
FIG. 2B is a cross-sectional view of one embodiment of an alternative electronic package according to the present invention.

FIG. 2B is a cross-sectional view of another embodiment of an electronic package 225 according to the present invention. Electronic package 225 comprises a die 203, a substrate 205, one or more solder balls 207 for electronically coupling substrate 205 to board 208, a die attach material 209, and a molding compound 211. Bonding wires 213 electrically couple a first surface 215 of die 203 to a first surface 217 of substrate 205. Die attach material 209 attaches the die 203 to the first surface 217 of substrate 205. The die attach material 209 includes materials described above with reference to FIG. 2A. Electronic package 225 which includes die attachment material 209 has the same excellent attachment characteristics as electronic package 201 shown in FIG. 2A. Electronic package 225 is less susceptible to cyclic strain, peeling, and cracking, than electronic package 125 (shown in FIG. 1B).

Figure 3:
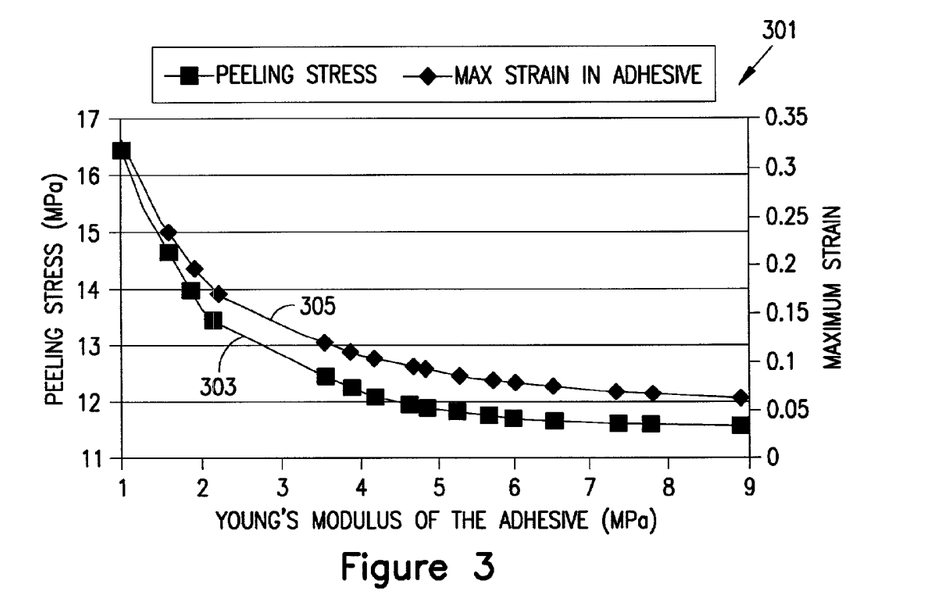
FIG. 3 is a graph showing peeling stress and maximum strain versus the Young's modulus of a material securing a die to a substrate according to the present invention.

FIG. 3 is a graph 301 showing a simulated peeling stress curve 303 and a simulated maximum strain curve 305 versus the Young's modulus for a die attach material securing a die to a substrate according to the present invention. Peeling stress curve 303 and maximum strain curve 305 were generated using finite element analysis. Referring to FIG. 2B peeling stress is the stress at the interface between die attach material 209 and substrate 205. In general, the probability of package failure increases as the peeling stress increases. As can be seen in graph 301, the peeling stress curve 303 decreases rapidly as the Young's modulus increases from about 1 megapascal to about 4 megapascal. Therefore, the probability of package failure decreases as the Young's modulus increases from about 1 megapascal to about 4 megapascal. Again, referring to FIG. 2B, maximum strain is the strain experienced by die attach material 209. As can be seen in graph 301, the maximum strain curve 305 decreases rapidly as the Young's modulus increases from about 1 megapascal to about 4 megapascal. Data shown in graph 301 were generated using finite element analysis and can be extrapolated by those skilled in the art down to about 0.1 megapascals and out to about 20 megapascals (at a solder reflow temperature).

Figure 4:
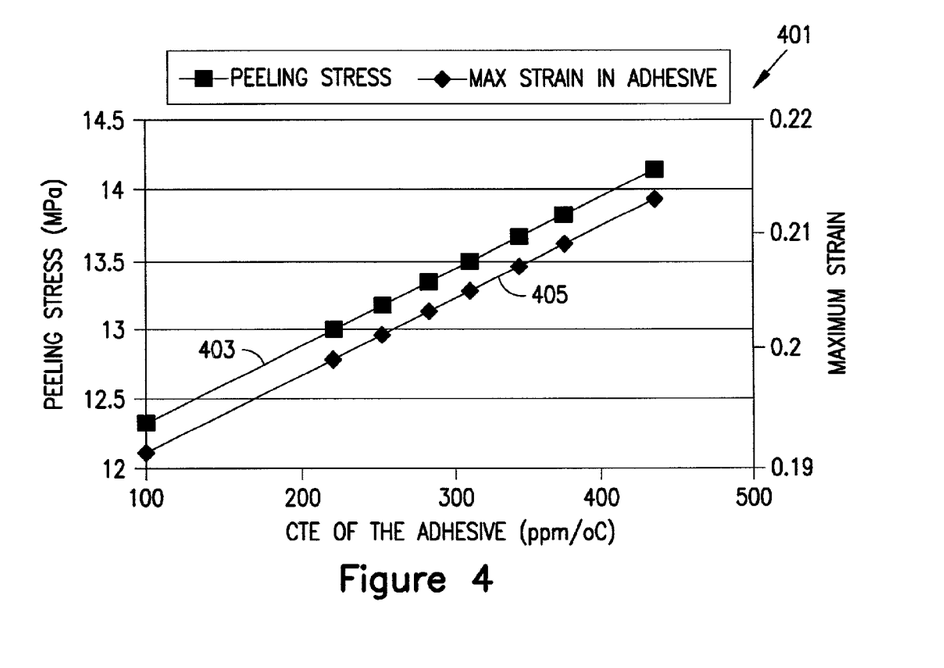
FIG. 4 is a graph showing peeling stress and maximum strain versus the coefficient of thermal expansion for a material useful in securing a die to a substrate according to the present invention.

FIG. 4 is a graph 401 showing a simulated peeling stress curve 403 and a simulated maximum strain curve 405 versus a coefficient of thermal expansion (CTE) for a die attach material securing a die to a substrate according to the present invention. Peeling stress curve 403 and maximum strain curve 405 were generated using finite element analysis. In general, the probability of package failure increases as the peeling stress increases and as the maximum strain increases. As can be seen in graph 401, peeling stress curve 403 increases linearly as the CTE increases from about 100 ppm (parts per million)/° C. to about 500 ppm/° C. Also, as can be seen in graph 401, maximum strain curve 403 increases linearly as the CTE increases from about 100 ppm (parts per million)/° C. to about 500 ppm/° C. Therefore, the probability of package failure increases as the CTE increases from about 100 ppm (parts per million)/° C. to about 500 ppm (parts per million)/° C. Since the probability of package failure increases as the CTE increases, package reliability is increased by using a die attach material that has a low CTE. In one embodiment of the present invention, the $\alpha_2$ for the die attach material is less than about 400 (four-hundred) ppm (parts per million)/° C.

Figure 5:
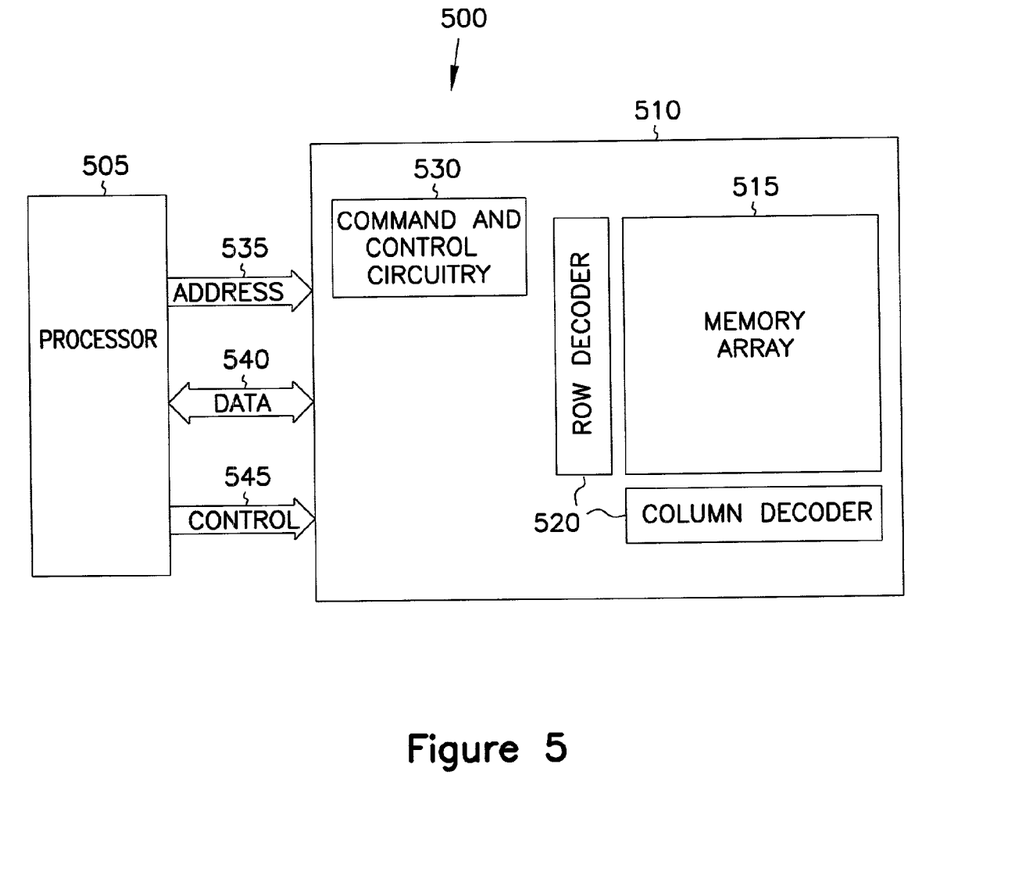
FIG. 5 is a block diagram of one embodiment of a computer system including a memory array comprising memory dice packaged according to the present invention.

FIG. 5 is a block diagram of a computer system 500 according to the present invention. System 500 comprises processor 505 and memory board assembly 510. Memory board assembly 510 comprises memory array 515, address circuitry 520, and read circuitry 530, and is coupled to processor 505 by address bus 535, data bus 540, and control bus 545. In one embodiment, the processor 505 is packaged as die 203 in electronic package 201, as shown in FIG. 2A. In another embodiment, the memory array processor 505 is packaged as die 203 in electronic package 201, as shown in FIG. 2B. In still another embodiment, the memory array 515 is packaged as die 203 in electronic package 201, as shown in FIG. 2A. In yet another embodiment, the memory array 515 is packaged as die 203 in electronic package 225, as shown in FIG. 2B. Processor 505, through address bus 535, data bus 540, and control bus 545 communicates with memory board assembly 510. In a read operation initiated by processor 505, address information, data information, and control information are provided to memory board assembly 510 through busses 535, 540, and 545. This information is decoded by addressing circuitry 520, including a row decoder and a column decoder, and read circuitry 530. Successful completion of the read operation results in information from memory array 515 being communicated to processor 505 over data bus 540.

CONCLUSION

An electronic device package has been described. In one embodiment, the electronic device package comprises a substrate, a die, and a material having a Young's modulus of between about 0.1 megapascals and about 20 megapascals (at a solder reflow temperature) attaching the die to the substrate. A package utilizing a material having a Young's modulus of between about 0.1 megapascals and about 20 megapascals (at a solder reflow temperature) shows superior reliability when compared to an integrated circuit package utilizing a material having a Young's modulus of less than about 0.1 megapascal (at a solder reflow temperature).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit package comprising:
   a substrate;
   a die; and
   a material having a Young's modulus of greater than 3 megapascals and a peeling stress of less than 13 megapascals, at a solder reflow temperature, attaching the die to the substrate.

2. The integrated circuit package of claim 1, wherein the substrate comprises a ceramic.

3. The integrated circuit package of claim 1, wherein the die comprises one or more memory circuits.

4. The integrated circuit package of claim 1, wherein the die comprises one or more processor circuits.

5. The integrated circuit package of claim 1, wherein the die comprises one or more logic circuits.

6. The integrated circuit package of claim 1 wherein the die comprises one or more application specific integrated circuits.

7. The integrated circuit package of claim 1, wherein the material comprises a poly epoxide formed from one epoxide.

8. The integrated circuit package of claim 1, wherein the material comprises a poly epoxide formed from two or more epoxides.

9. The integrated circuit package of claim 1, wherein the material comprises a polyacrylate.

10. The integrated circuit package of claim 1, wherein the material comprises a polyolefin.

11. The integrated circuit package of claim 1, wherein the material comprises a polyimide.

12. The integrated circuit package of claim 1, wherein the material comprises a mixture of at least two of a poly epoxide, polyacrylate, polyimide, and polyolefin.

13. The integrated circuit package of claim 1, wherein the material comprises a copolymer of at least two of a poly epoxide, a polyacrylate, polyimide, and polyolefin.

14. The integrated circuit package of claim 1, wherein the material comprises a mixture of a poly epoxide and a polyimide.

15. The integrated circuit package of claim 1, wherein the material comprises a copolymer of a poly epoxide and a polyimide.

16. The integrated circuit package of claim 1, wherein the material has a Shore A hardness of greater than about 70.

17. The integrated circuit package of claim 1, wherein the material has a Shore D hardness of greater than about 20.

18. An integrated circuit package comprising:
    a substrate;
    a die; and
    a material having a coefficient of thermal expansion $\alpha_2$ of less than about 400 (four-hundred) ppm/° C. attaching the die to the substrate, wherein the material has a Young's modulus of greater than 4 megapascals, at a solder reflow temperature of between 200 to 280° C., a peeling stress of less than 13 megapascals, and a maximum strain of less than 0.1.

19. The integrated circuit package of claim 18, wherein the substrate comprises a single metal layer glass-epoxide.

20. The integrated circuit package of claim 18, wherein the die comprises one or more processor circuits.

21. The integrated circuit package of claim 18 wherein the die comprises one or more memory circuits.

22. The integrated circuit package of claim 18, wherein the die comprises one or more logic circuits.

23. The integrated circuit package of claim 18, wherein the die comprises one or more application specific integrated circuits.

24. The integrated circuit package of claim 18, wherein the material comprises a poly epoxide formed from one epoxide.

25. The integrated circuit package of claim 18, wherein the material comprises a poly epoxide formed from two or more epoxides.

26. The integrated circuit package of claim 18, wherein the material comprises a polyacrylate.

27. The integrated circuit package of claim 18, wherein the material comprises a polyolefin.

28. The integrated circuit package of claim 18, wherein the material comprises a polyimide.

29. The integrated circuit package of claim 18, wherein the material comprises a mixture of at least two of a poly epoxide, polyacrylate, polyimide, and polyolefin.

30. The integrated circuit package of claim 18, wherein the material comprises a copolymer of at least two of a poly epoxide, a polyacrylate, polyimide, and polyolefin.

31. The integrated circuit package of claim 18, wherein the material comprises a mixture of a poly epoxide and a polyimide.

32. The integrated circuit package of claim 18, wherein the material comprises a copolymer of a poly epoxide and a polyimide.

33. The integrated circuit package of claim 18, wherein the material has a Shore A hardness of greater than about 70.

34. The integrated circuit package of claim 18, wherein the material has a Shore D hardness of greater than about 20.

35. An integrated circuit package comprising:
    a rigid substrate;
    a die; and
    a rigid die attach material attaching the die to the substrate and having a Young's modulus of over 0.1 megapascals at a solder reflow temperature of between 200 to 280° C. and a peeling stress of less than 17 megapascals.

36. The integrated circuit package of claim 35, wherein the substrate comprises a printed circuit board.

37. The integrated circuit package of claim 35, wherein the die comprises a communication circuit.

38. The integrated circuit package of claim 35, wherein the die comprises one or more memory circuits.

39. The integrated circuit package of claim 35, wherein the die comprises one or more processor circuits.

40. The integrated circuit package of claim 35, wherein the die comprises one or more logic circuits.

41. The integrated circuit package of claim 35, wherein the die comprises one or more application specific integrated circuits.

42. The integrated circuit package of claim 35, wherein the rigid die attach material comprises a poly epoxide formed from one epoxide.

43. The integrated circuit package of claim 35, wherein the rigid die attach material comprises a poly epoxide formed from two or more epoxides.

44. The integrated circuit package of claim 35, wherein the rigid die attach material comprises a polyacrylate.

45. The integrated circuit package of claim 35, wherein the rigid die attach material comprises a polyolefin.

46. The integrated circuit package of claim 35, wherein the rigid die attach material comprises a polyimide.

47. The integrated circuit package of claim 35, wherein the rigid die attach material comprises a mixture of at least two of a poly epoxide, polyacrylate, polyimide, and polyolefin.

48. The integrated circuit package of claim 35, wherein the rigid die attach material comprises a copolymer of at least two of a poly epoxide, a polyacrylate, polyimide, and polyolefin.

49. The integrated circuit package of claim 35, wherein the rigid die attach material comprises a mixture of a poly epoxide and a polyimide.

50. The integrated circuit package of claim 35, wherein the rigid die attach material comprises a copolymer of a poly epoxide and a polyimide.

51. The integrated circuit package of claim 35, wherein the rigid die attach material has a Shore A hardness of greater than about 70.

52. The integrated circuit package of claim 35, wherein the rigid die attach material has a Shore D hardness of greater than about 20.

53. An integrated circuit package comprising:
a ceramic substrate;
a die; and
a material having a Young's modulus of between about 0.1 megapascals and less than 3 megapascals, at a solder reflow temperature of between 200 to 280° C., attaching the die to the substrate, the material including a peeling stress of less than 17 megapascals.

54. The integrated circuit package of claim 53, wherein the ceramic substrate comprises a multi-metal layer ceramic substrate.

55. The integrated circuit package of claim 53, wherein the die comprises a communication circuit fabricated on a semiconductor.

56. The integrated circuit package of claim 53, wherein the die comprises one or more memory circuits.

57. The integrated circuit package of claim 53, wherein the die comprises one or more processor circuits.

58. The integrated circuit package of claim 53, wherein the die comprises one or more logic circuits.

59. The integrated circuit package of claim 53, wherein the die comprises one or more application specific integrated circuits.

60. The integrated circuit package of claim 53, wherein the material comprises one or more epoxides, poly epoxides, copolymers of epoxides, or mixtures thereof.

61. The integrated circuit package of claim 53, wherein the material comprises a poly epoxide formed from one epoxide.

62. The integrated circuit package of claim 53, wherein the material comprises a poly epoxide formed from two or more epoxides.

63. The integrated circuit package of claim 53, wherein the material comprises a polyacrylate.

64. The integrated circuit package of claim 53, wherein the material comprises a polyolefin.

65. The integrated circuit package of claim 53, wherein the material comprises a polyimide.

66. The integrated circuit package of claim 53, wherein the material comprises a mixture of at least two of a poly epoxide, polyacrylate, polyimide, and polyolefin.

67. The integrated circuit package of claim 53, wherein the material comprises a copolymer of at least two of a poly epoxide, a polyacrylate, polyimide, and polyolefin.

68. The integrated circuit package of claim 53, wherein the material comprises a mixture of a poly epoxide and a polyimide.

69. The integrated circuit package of claim 53, wherein the material comprises a copolymer of a poly epoxide and a polyimide.

70. The integrated circuit package of claim 53, wherein the material has a Shore A hardness of greater than about 70.

71. The integrated circuit package of claim 53, wherein the material has a Shore D hardness of greater than about 20.

72. An integrated circuit package comprising:
a ceramic substrate;
a die; and
a rigid die attach material attaching the die to the substrate, wherein the rigid die attach material includes a Young's modulus of greater than 4 megapascals and a peeling stress of less than 12 megapascals.

73. The integrated circuit package of claim 72, wherein the ceramic substrate comprises a multilayered ceramic substrate.

74. The integrated circuit package of claim 72, wherein the die comprises germanium.

75. The integrated circuit package of claim 72, wherein the die comprises one or more memory circuits.

76. The integrated circuit package of claim 72, wherein the die comprises one or more processor circuits.

77. The integrated circuit package of claim 72, wherein the die comprises one or more logic circuits.

78. The integrated circuit package of claim 72, wherein the die comprises one or more application specific integrated circuits.

79. The integrated circuit package of claim 72, wherein the rigid die attach material comprises one or more epoxides, poly epoxides, copolymers of epoxides, or mixtures thereof.

80. The integrated circuit package of claim 72, wherein the rigid die attach material comprises a poly epoxide formed from one epoxide.

81. The integrated circuit package of claim 72, wherein the rigid die attach material comprises a poly epoxide formed from two or more epoxides.

82. The integrated circuit package of claim 72, wherein the rigid die attach material comprises a polyacrylate.

83. The integrated circuit package of claim 72, wherein the rigid die attach material comprises a polyolefin.

84. The integrated circuit package of claim 72, wherein the rigid die attach material comprises a polyimide.

85. The integrated circuit package of claim 72, wherein the rigid die attach material comprises a mixture of at least two of a poly epoxide, polyacrylate, polyimide, and polyolefin.

86. The integrated circuit package of claim 72, wherein the rigid die attach material comprises a copolymer of at least two of a poly epoxide, a polyacrylate, polyimide, and polyolefin.

87. The integrated circuit package of claim 72, wherein the rigid die attach material comprises a mixture of a poly epoxide and a polyimide.

88. The integrated circuit package of claim 72, wherein the rigid die attach material comprises a copolymer of a poly epoxide and a polyimide.

89. The integrated circuit package of claim 72, wherein the rigid die attach material has a Shore A hardness of greater than about 70.

90. The integrated circuit package of claim 72, wherein the rigid die attach material has a Shore D hardness of greater than about 20.

91. An integrated circuit package comprising:
a substrate;
a die; and
a material having a coefficient of thermal expansion $\alpha_2$ of between about one and about sixty-two ppm/° C. attaching the die to the substrate, wherein the material has a Young's modulus of between 0.1 megapascals and less than 3 megapascals, at a solder reflow temperature of between 200 to 280° C.

92. The integrated circuit package of claim 91, wherein the substrate comprises a single metal layer glass-epoxide.

93. The integrated circuit package of claim 91, wherein the die comprises one or more processor circuits.

94. The integrated circuit package of claim 91 wherein the die comprises one or more memory circuits.

95. The integrated circuit package of claim 91, wherein the die comprises one or more logic circuits.

96. The integrated circuit package of claim 91, wherein the die comprises one or more application specific integrated circuits.

97. The integrated circuit package of claim 91, wherein the material comprises a poly epoxide formed from one epoxide.

98. The integrated circuit package of claim 91, wherein the material comprises a poly epoxide formed from two or more epoxides.

99. The integrated circuit package of claim 91, wherein the material comprises a polyacrylate.

100. An integrated circuit package comprising:
    a substrate;
    a die; and
    a material having a coefficient of thermal expansion $\alpha_2$ of between about 151 (one-hundred and fifty-one) and about 400 (four-hundred) ppm/° C. attaching the die to the substrate, wherein the material has a Young's modulus of between 0.1 megapascals and less than 3 megapascals, at a solder reflow temperature of between 200 to 280° C.

101. The integrated circuit package of claim 100, wherein the material comprises a polyolefin.

102. The integrated circuit package of claim 100, wherein the material comprises a polyimide.

103. The integrated circuit package of claim 100, wherein the material comprises a mixture of at least two of a poly epoxide, polyacrylate, polyimide, and polyolefin.

104. The integrated circuit package of claim 100, wherein the material comprises a copolymer of at least two of a poly epoxide, a polyacrylate, polyimide, and polyolefin.

105. The integrated circuit package of claim 100, wherein the material comprises a mixture of a poly epoxide and a polyimide.

106. The integrated circuit package of claim 100, wherein the material comprises a copolymer of a poly epoxide and a polyimide.

107. The integrated circuit package of claim 100, wherein the material has a Shore A hardness of greater than about 70.

108. The integrated circuit package of claim 100, wherein the material has a Shore D hardness of greater than about 20.

109. An integrated circuit package comprising:
    a substrate;
    a die; and
    a polyimide material having a Young's modulus of between 0.1 megapascals and about 20 megapascals, at a solder reflow temperature of between 200 to 280° C., to attaching the die to the substrate, wherein the polyimide material is a compound of the formula:

wherein
    n is 2 to about 1,000;
    each $R_1$, $R_2$, and $R_3$ is independently $(C_1-C_{24})$alkyl, $(C_2-C_{24})$alkenyl, $(C_1-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;
    any alkyl, alkenyl, alkynyl, cycloalkyl, aryl, or heteroaryl can optionally be substituted with one or more halo, trifluoromethyl, cyano, hydroxy, nitro, C(=O)OR$_6$, wherein $R_6$ is hydrogen or $(C_1-C_{24})$alkyl, or NR$_7$R$_8$, wherein each $R_7$ and $R_8$ are independently hydrogen or $(C_1-C_{24})$alkyl; and
    any alkyl, alkenyl, or alkynyl is optionally interrupted with one or more oxo, thio, sulfonyl, or sulfinyl;
    or a suitable salt thereof.

110. An integrated circuit package comprising:
    a substrate;
    a die; and
    a polyimide material having a Young's modulus of between 0.1 megapascals and about 20 megapascals, at a solder reflow temperature, for attaching the die to the substrate, wherein the polyimide material is a compound of the formula:

wherein
    n is 2 to about 1,000;
    each $R_1$, $R_2$, and $R_3$ is independently $(C_1-C_{24})$alkyl, $(C_2-C_{24})$alkenyl, $(C_1-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;
    any alkyl, alkenyl, alkynyl, cycloalkyl, aryl, or heteroaryl can optionally be substituted with one or more halo, trifluoromethyl, cyano, hydroxy, nitro, C(=O)OR$_6$, wherein $R_6$ is hydrogen or $(C_1-C_{24})$alkyl, or NR$_7$R$_8$, wherein each $R_7$ and $R_8$ are independently hydrogen or $(C_1-C_{24})$alkyl; and
    any alkyl, alkenyl, or alkynyl is optionally interrupted with one or more oxo, thio, sulfonyl, or sulfinyl;
    or a suitable salt thereof; and
    wherein n is in a range of two to 1000.

111. An integrated circuit package comprising:
    a substrate;
    a die; and
    a polyimide material having a Young's modulus of between 0.1 megapascals and about 20 megapascals, at a solder reflow temperature of between 200 to 280° C., to attaching the die to the substrate, wherein the polyimide material is a compound of the formula:

wherein $R_1$ is $(C_1–C_{24})$alkenyl, and wherein each $R_2$ and $R_3$ is independently $(C_1–C_{24})$alkyl, $(C_2–C_{24})$alkenyl, $(C_1–C_{24})$alkyl, $(C_3–C_8)$cycloalkyl, $(C_1–C_{24})$alkyl $(C_3–C_8)$cycloalkyl, $(C_6–C_{10})$aryl, $(C_6–C_{10})$heteroaryl, $(C_1–C_{24})$alkyl $(C_6–C_{10})$aryl, $(C_1–C_{24})$alkyl $(C_6–C_{10})$heteroaryl, $(C_6–C_{10})$aryl $(C_1–C_{24})$alkyl, $(C_6–C_{10})$heteroaryl $(C_1–C_{24})$alkyl, or $(C_3–C_8)$cycloalkyl $(C_1–C_{24})$alkyl;

any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1–C_{24})$alkyl, or $NR_7R_8$, wherein each $R_7$ and $R_8$ are independently hydrogen or $(C_1–C_{24})$alkyl; and any alkyl, alkenyl, or alkynyl is optionally interrupted with one or more oxo, thio, sulfonyl, or sulfinyl; or a suitable salt thereof.

112. An integrated circuit package comprising:
a substrate;
a die; and
a polyimide material having a Young's modulus of between 0.1 megapascals and about 20 megapascals, at a solder reflow temperature of between 200 to 280° C., to attaching the die to the substrate, wherein the polyimide material is a compound of the formula:

wherein $R_2$ is $(C_2–C_{24})$alkenyl, and wherein each $R_1$ and $R_3$ is independently $(C_1–C_{24})$alkyl, $(C_2–C_{24})$alkenyl, $(C_1–C_{24})$alkyl, $(C_3–C_8)$cycloalkyl, $(C_1–C_{24})$alkyl $(C_3–C_8)$cycloalkyl, $(C_6–C_{10})$aryl, $(C_6–C_{10})$heteroaryl, $(C_1–C_{24})$alkyl $(C_6–C_{10})$aryl, $(C_1–C_{24})$alkyl $(C_6–C_{10})$heteroaryl, $(C_6–C_{10})$aryl $(C_1–C_{24})$alkyl, $(C_6–C_{10})$heteroaryl $(C_1–C_{24})$alkyl, or $(C_3–C_8)$cycloalkyl $(C_1–C_{24})$alkyl;

any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1–C_{24})$alkyl, or $NR_7R_8$, wherein each $R_7$ and $R_8$ are independently hydrogen or $(C_1–C_{24})$alkyl; and any alkyl, alkenyl, or alkynyl is optionally interrupted with one or more oxo, thio, sulfonyl, or sulfinyl; or a suitable salt thereof.

113. An integrated circuit package comprising:
a substrate;
a die; and
a polyimide material having a Young's modulus of between 0.1 megapascals and about 20 megapascals, at a solder reflow temperature of between 200 to 280° C., to attaching the die to the substrate, wherein the polyimide material is a compound of the formula:

wherein $R_3$ is $(C_2–C_{24})$alkenyl, and wherein each $R_1$ and $R_2$ is independently $(C_1–C_{24})$alkyl, $(C_2–C_{24})$alkenyl, $(C_1–C_{24})$alkyl, $(C_3–C_8)$cycloalkyl, $(C_1–C_{24})$alkyl $(C_3–C_8)$cycloalkyl, $(C_6–C_{10})$aryl, $(C_6–C_{10})$heteroaryl, $(C_1–C_{24})$alkyl $(C_6–C_{10})$aryl, $(C_1–C_{24})$alkyl $(C_6–C_{10})$heteroaryl, $(C_6–C_{10})$aryl $(C_1–C_{24})$alkyl, $(C_6–C_{10})$heteroaryl $(C_1–C_{24})$alkyl, or $(C_3–C_8)$cycloalkyl $(C_1–C_{24})$alkyl;

any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1–C_{24})$alkyl, or $NR_7R_8$, wherein each $R_7$ and $R_8$ are independently hydrogen or $(C_1–C_{24})$alkyl; and any alkyl, alkenyl, or alkynyl is optionally interrupted with one or more oxo, thio, sulfonyl, or sulfinyl; or a suitable salt thereof.

114. An integrated circuit package comprising:
a substrate;
a die; and
a polyimide material having a Young's modulus of between 0.1 megapascals and about 20 megapascals, at a solder reflow temperature, for attaching the die to the substrate, wherein the polyimide material is a compound of the formula:

wherein
n is 2 to about 1,000;
each $R_1$, $R_2$, and $R_3$ is independently $(C_1–C_{24})$alkyl, $(C_2–C_{24})$alkenyl, $(C_1–C_{24})$alkyl, $(C_3–C_8)$cycloalkyl, $(C_1–C_{24})$alkyl $(C_3–C_8)$cycloalkyl, $(C_6–C_{10})$aryl, $(C_6–C_{10})$heteroaryl, $(C_1–C_{24})$alkyl $(C_6–C_{10})$aryl, $(C_1–C_{24})$alkyl $(C_6–C_{10})$heteroaryl, $(C_6–C_{10})$aryl $(C_1–C_{24})$alkyl, $(C_6–C_{10})$heteroaryl $(C_1–C_{24})$alkyl, or $(C_3–C_8)$cycloalkyl $(C_1–C_{24})$alkyl;

any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1–C_{24})$alkyl, or $NR_7R_8$, wherein each $R_7$ and $R_8$ are independently hydrogen or $(C_1–C_{24})$alkyl; and any alkyl, alkenyl, or alkynyl is optionally interrupted with one or more oxo, thio, sulfonyl, or sulfinyl; or a suitable salt thereof; and wherein the substrate comprises a ceramic.

115. An integrated circuit package comprising:
a substrate;
a die; and a polyimide material having a Young's modulus of between 0.1 megapascals and about 20 megapascals, at a solder reflow temperature, for attaching the die to the substrate, wherein the polyimide material is a compound of the formula:

wherein
n is 2 to about 1,000;
each $R_1$, $R_2$, and $R_3$ is independently $(C_1-C_{24})$alkyl, $(C_2-C_{24})$alkenyl, $(C_1-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;
any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1-C_{24})$alkyl, or $NR_7R_8$, wherein each $R_7$ and $R_8$ are independently hydrogen or $(C_1-C_{24})$alkyl; and
any alkyl, alkenyl, or alkynyl is optionally interrupted with one or more oxo, thio, sulfonyl, or sulfinyl;
or a suitable salt thereof; and
wherein the die comprises one or more memory circuits.

116. An apparatus comprising:
a die having a bottom surface, the bottom surface including a first area with contacts thereon and a second area free of contacts and radially outside the first area;
a substrate having a top surface that is mechanically attached to the second area of the bottom surface of the die with a die attach material having a Young's modulus of at least 0.1 megapascals at a solder reflow temperature and a coefficient of thermal expansion a $\alpha_2$ of about 400 parts per million, the substrate including an interior aperture aligned with the first area of the bottom surface of the die, the substrate further including a bottom surface that includes contacts thereon;
at least two wires connected to the contacts on the bottom surface of the die, extending through the interior aperture of the substrate, and connected to the contacts on the bottom surface of the substrate;
a board having a top surface that is mechanically attached to the bottom surface of the substrate with one or more solder balls in electrical communication with the contacts on the bottom surface of the substrate, the solder balls having at a solder reflow temperature of between 200 to 280° C.; and
a molding compound to cover the die, the die attach material, and a portion of the top surface of the substrate, the molding compound extending through the interior aperture of the substrate and enclosing the wires, wherein the board is free of contact to the molding compound.

117. The apparatus of claim 116, wherein the die attach material is a polyimide material that is a compound of the formula:

wherein
n is 2 to about 1,000;
each $R_1$, $R_2$, and $R_3$ is independently $(C_1-C_{24})$alkyl, $(C_2-C_{24})$alkenyl, $(C_1-C_{24})$alkyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;
any alkyl, alkenyl, alkynyl, cycloalkyl, aryl, or heteroaryl can optionally be substituted with one or more halo, trifluoromethyl, cyano, hydroxy, nitro, $C(=O)OR_6$, wherein $R_6$ is hydrogen or $(C_1-C_{24})$alkyl, or $NR_7R_8$, wherein each $R_7$ and $R_8$ are independently hydrogen or $(C_1-C_{24})$alkyl; and
any alkyl, alkenyl, or alkynyl is optionally interrupted with one or more oxo, thio, sulfonyl, or sulfinyl;
or a suitable salt thereof; and
wherein the substrate comprises a ceramic.

* * * * *

UNITED STATES PATENT AND TRADEMARK OFFICE
CERTIFICATE OF CORRECTION

PATENT NO. : 7,122,908 B2  Page 1 of 1
APPLICATION NO. : 09/775366
DATED : October 17, 2006
INVENTOR(S) : Jiang et al.

It is certified that error appears in the above-identified patent and that said Letters Patent is hereby corrected as shown below:

In column 5, line 26, delete "Tg" and insert -- $T_g$ --, therefor.

In column 8, lines 8-9, delete "( $C_1C_{24}$)alkyl" and insert -- $(C_1-C_{24})$alkyl --, therefor.

In column 15, line 1, in Claim 91, after "than" delete "$_3$" and insert -- 3 --, therefor.

In column 16, line 49, in Claim 110, delete "$(C_1-C_{24}$alkyl" and insert -- $(C_1-C_{24})$alkyl --, therefor.

In column 19, line 42, in Claim 116, after "expansion" delete "a".

Signed and Sealed this

First Day of May, 2007

JON W. DUDAS
*Director of the United States Patent and Trademark Office*